Sept. 2, 1958

G. A. SILVEY 2,850,688

SEMICONDUCTOR CIRCUIT ELEMENTS

Filed Feb. 8, 1956

*INVENTOR.*
GENE A. SILVEY

BY

Alvin J. Riddles

AGENT

United States Patent Office 2,850,688
Patented Sept. 2, 1958

2,850,688

SEMICONDUCTOR CIRCUIT ELEMENTS

Gene A. Silvey, Poughkeepsie, N. Y., assignor to International Business Machines Corporation, New York, N. Y., a corporation of New York Application February 8, 1956, Serial No. 564,198

10 Claims. (Cl. 317—237)

This invention relates to semiconductor circuit elements and in particular to semiconductor circuit elements wherein the semiconductor material comprises zinc arsenide.

In the development of the art associated with semiconductor devices such as transistors and rectifiers it has been found that the inherent properties of semiconductor material upon which the performance of the device depend in many cases introduce limitations of performance. Examples of these properties are the energy gap width and the mobility of the carriers. These properties vary differently with respect to each other under the influence of temperature and biasing potential for each semiconductor material. In many cases these properties are of such a nature that, in a given semiconductor device, a condition employed to avoid an undesirable effect due to one property of the semiconductor material frequently will serve to aggravate an undesirable effect due to another property. In such cases the use of a semiconductor having properties that react differently to environment and circuit conditions is desirable.

What has been discovered is that the compound zinc arsenide $Zn_3As_2$ may be given semiconductor properties by purifying to the degree suitable for semiconductor use and introducing into the purified zinc arsenide, conductivity directing impurities that are totally different from conductivity directing impurities known heretofore in the art. This semiconductor zinc arsenide may then be used in the fabrication of semiconductor devices and such devices made from this material will have inherent properties that are different and have different relationships to each other so that they will be useable in a wider variety of environmental and circuit conditions than semiconductor devices heretofore available in the art.

Accordingly, a primary object is to provide a zinc arsenide semiconductor device.

Another object is to provide a zinc arsenide transistor.

Another object is to provide a zinc arsenide photosensitive device.

Still another object is to provide a zinc arsenide rectifier.

A related object is to provide an infrared filter of zinc arsenide.

Other objects of the invention will be pointed out in the following description and claims and illustrated in the accompanying drawings, which disclose, by way of example, the principle of the invention and the best mode, which has been contemplated, of applying that principle.

Figure 1:
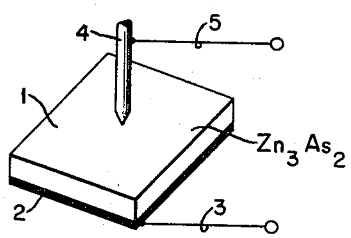
Figure 1 is a point contact rectifier made of semiconductor zinc arsenide.

The zinc arsenide compound has been found to be a subliming solid having a melting point in the vicinity of 1015 degrees centigrade at a pressure of approximately 50 lbs. per square inch. It has a crystalline structure made of cells that are of the tetragonal system having a c/a ratio of approximately 2 and approximately 160 atoms per cell. The energy gap width of semicondutor zinc arsenide is 1.0 electron volt. The above compound can be made to exhibit N-type or P-type conductivity by the introduction of appropriate conductivity directing impurities. The elements of group Ib of the periodic table, namely copper, silver and gold have been found to be among those elements that can produce P-type conductivity and the elements of group 6a of the periodic table, namely sulfur, selenium and tellurium have been found to be among those elements that can produce N-type conductivity in zinc arsenide.

In order to be suitable for all semiconductor applications the zinc arsenide material should have a high degree of purity, a specific resistivity within a range sufficient to give suitable efficiency to the various parameters of the device made therefrom and have a sufficiently small number of carrier traps so that carrier recombination in the material does not prevent transistor action. The above requirements are general and take on different degrees of importance depending on the performance expected from the semiconductor device. For example, in a simple rectifier the absence of carrier traps is not of great importance whereas in transistors and photocells all three requirements have a definite effect on performance.

A brief insight into the effects of these requirements may be obtained from the following articles and the references cited therein.

Junction Transistor Electronics by J. L. Moll—Proceedings of I. R. E.—December 1955, pages 1807–1819. Photoconduction in Germanium and Silicon by M. L. Schultz and G. A. Morton—Proceedings of I. R. E.—December 1955, pages 1819–1827.

The zinc arsenide material may be provided in any manner that will yield material having the requisite purity, resistivity and absence of carrier traps necessary for performance in a particular semiconductor device. The following description of two methods of providing semiconductor zinc arsenide is provided to aid in understanding and practicing the invention, it being understood that the invention should not be limited to a particular process for, as will be apparent from the following description, many variations in the process are available to one skilled in the art in forming the material. In any process employed the steps of the process will be directed toward providing zinc arsenide with the requisite purity and resistivity. For this reason the zinc and the arsenic are very highly purified when reacted and the environment is very closely controlled at each step in the process. The zinc has physical properties such that it may readily be purified by the technique known in the art as zone refining. The arsenic, however, is a subliming solid and as such requires pressures for melting that at present would make a zone refining operation difficult. The arsenic may be partially purified by fractional sublimation and through this process impurities having vapor pressures above and below the range of arsenic may be removed. The remaining impurities in the arsenic may be removed by zone refining the zinc arsenide compound in a manner to be later described. It should be noted that in semiconductor material the presence of one impurity atom to ten million atoms is sufficient to affect performance, hence any methods used for purification and environment control should be capable of maintaining this type of purity. It has been established in the art that carrier traps are at a minimum in single crystals of a semiconductor material. It is for this reason that an effort is made in the process of providing the material to cause the material to assume the physical form of a single crystal suitable for semiconductor device fabrication.

Since zinc arsenide is a subliming solid one method of providing it is to cause vapors of zinc and arsenic in stoichiometric quantities to come together at a sufficiently elevated temperature. As a result of the reaction, small crystals of zinc arsenide sublime out and may be used for some semiconductor devices. Both the conductivity and the resistivity may be controlled by introduction of selected impurities either as a separate vapor or into the constituents prior to vaporization.

In the event that the semiconductor device that is to be made from the zinc arsenide requires a single crystal size larger than that which can reliably be achieved by the above process the following method may be employed. As in the above method, stoichiometric quantities of highly purified zinc and arsenic are reacted at elevated temperatures to form the zinc arsenide. In practice it has been found that an excess of approximately .01% of arsenic over the stoichiometric quantity will compensate for the difference in vapor pressure of the two materials. The resulting zinc arsenide is now purified to remove the impurities present in the constituents or acquired from the environment during the reastion. This may be accomplished by placing the material under pressure and temperature sufficient to permit melting so that zone refining may be performed. In practice this may be done by placing the zinc arsenide in a graphite container and sealing it, in the presence of a reducing atmosphere, in a quartz tube. The temperature is raised to about 1000° centigrade and the expansion of the reducing atmosphere in the tube raises the pressure to about 50 lbs. per square inch. A small region near one end of the material is further heated to form a molten zone and the molten zone is then moved to carry with it the impurities as is accomplished in the zone refining technique practiced in the art. At the end of the zone refining operation the zinc arsenide is removed from the tube and the portion containing the impurities is cut off.

The appropriate type and concentration of impurities may now be introduced into the zinc arsenide so as to provide a desired conductivity type and resistivity in the material. It has also been found advantageous to carefully heat treat the zinc arsenide to remove thermal stresses which are a source of carrier traps and to permit large single crystals to form. Both the impurity introduction and the heat treatment may be accomplished in a single temperature cycle. This may be done by heating the zinc arsenide under pressure in the presence of the impurity and distributing the impurity when the zinc arsenide is in a molten state by suitable agitation. Then cooling the material slowly through the liquidus and liquidus-solidus phases of the solidification. This material has been found to undergo a solid to solid phase transition at approximately 659° centigrade. This transition is a structural change with an associated energy shift and unless steps are taken to prevent it, thermal stresses may be set up in the material. One method of releasing this energy slowly is to set up a temperature gradient in the zinc arsenide sample so that one part is cooler than another, for example about 25° centigrade temperature difference from one end of the sample to the other, then, maintaining the gradient, cooling the sample very slowly through this range, for example about 1° centigrade per hour. The gradient causes the energy release to occur in only a portion of the sample at a given time and the slow cooling rate permits the energy to be radiated to the environment with a minimum of stress being set up in the sample. Once the transition region has been traversed more rapid cooling to room temperature may take place. When the sample has cooled, a single large crystal or several large single crystals are achieved which may then be cut so as to provide monocrystalline bodies for semiconductor devices.

Seed crystals may be cut from a sample and these in turn may be used in connection with the crystal pulling technique established in the art to provide large monocrystalline ingots. The only modification of the standard crystal pulling technique required for zinc arsenide is that the pulling be performed under sufficient pressure to minimize sublimation. The seed crystals may be oriented with respect to a particular crystallographic plane if desired, for example by the technique of X-ray diffraction established in the art, and monocrystalline ingots oriented with respect to a particular crystallographic plane may be grown therefrom.

Figure 2:
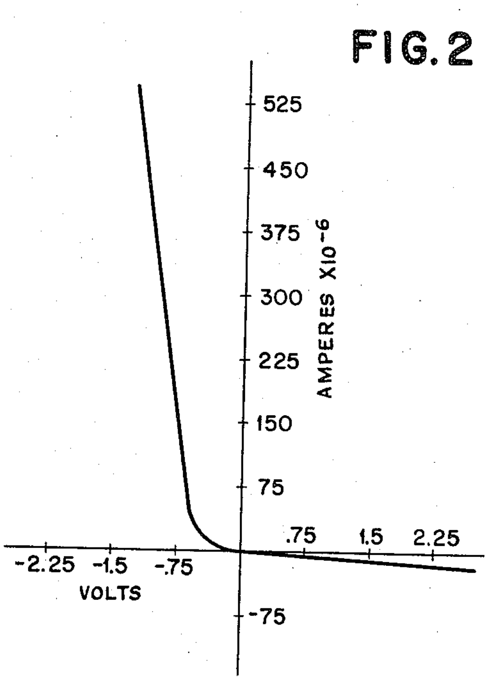
Figure 2 is a graph illustrating a representative voltage-current characteristic curve of a P-type semiconductor rectifier made of zinc arsenide in accordance with this invention.

The zinc arsenide semiconductor material may be employed in the manufacture of a wide variety of semiconductor devices. A point contact rectifier is shown in Figure 1 wherein the body 1 of zinc arsenide is provided having an ohmic contact 2 of solder or other suitable material to which is attached a terminal and lead 3 for external connection. A suitable point contact 4 for example of tungsten, or Phosphor bronze makes rectifying contact with the body 1 and an external connection terminal and lead 5 are attached. The output characteristic curve of the rectifier of Figure 1 is shown in Figure 2. Referring now to both Figures 1 and 2 and selecting for illustration purposes a P-type conductivity, zinc arsenide body 1 having a resistivity of 0.3 ohm centimeters when potentials as shown on the graph in Figure 2 are applied to terminals 3 and 5 through a power source not shown, the characteristic curve shown in Figure 2 was exhibited. The above described rectifier was found to have a forward resistance of 1100 ohms and a back resistance of 2 megohms.

Figure 3:
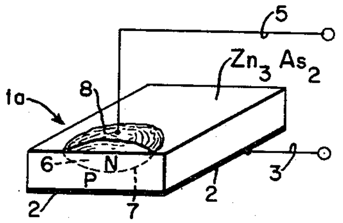
Figure 3 is a junction rectifier made of zinc arsenide.

In Figure 3 is shown a junction diode made by the alloy technique established in the art. In Figure 3 the body **1*a* is a semiconductor zinc arsenide of a particular conductivity type, for example P-type. A region of opposite type conductivity 6, for example N-type forming a junction barrier 7 is alloyed into the body 1*a* by applying a quantity 8 of an appropriate conductivity directing impurity, for example in this illustration tellurium, and heating until the impurity 8 fuses into the body 1*a* forming the junction 7. Ohmic contact 2 and external connection terminals and leads 3 and 5** are then applied as in Figure 1.

Figure 4:
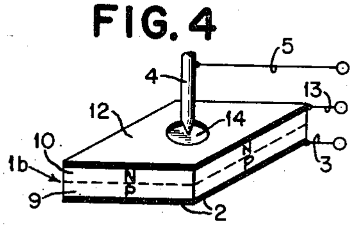
Figure 4 is a junction emitter point contact collector transistor having a body of semiconductor zinc arsenide.

Referring now to Figure 4 a junction emitter point contact collector transistor is shown to illustrate the application of both point contact and junction fabrication techniques in the formation of semiconductor devices made from this material. In Figure 4 the body **1*b* is of semiconductor zinc arsenide having two zones of opposite type conductivity respectively zones 9 and 10 separated by a barrier 7*a*. The body 1*b* may for example be provided by taking semiconductor zinc arsenide of one conductivity type and forming therein a region of opposite type conductivity by maintaining the body 1*b* at an appropriate temperature in the presence of an environment containing a vapor of an opposite conductivity directing impurity until the opposite type conductivity directing impurity diffuses into the body providing a juncton barrier 11 therein. Unnecessary material may be removed and an ohmic connection 2 and associated external connection 3 may be attached to zone 9 which zone may serve as the emitter of the transistor. A further ohmic connection 12 may be made to zone 10 and an external connection 13 may be provided so that zone 10 may serve as the base of the transistor and a point contact 4 and external connection 5 may be applied to zone 10 through an aperture 14 provided in the ohmic connection 12**, this connection may then serve as the collector of the transistor. The technique of electroforming established in the art may be applied to the collector 4 to increase amplification and yield other benefits if desired.

As may be seen from the above discussion the zinc arsenide material may be used to provide a wide variety of semiconductor devices of which Figures 1, 3 and 4 are examples. Further, each such device when subjected to light is both photoconductive and photovoltaic, the output signal being delivered directly or amplified depending on the type of electrodes applied and the electrode geometry of the particular device.

Figure 5:
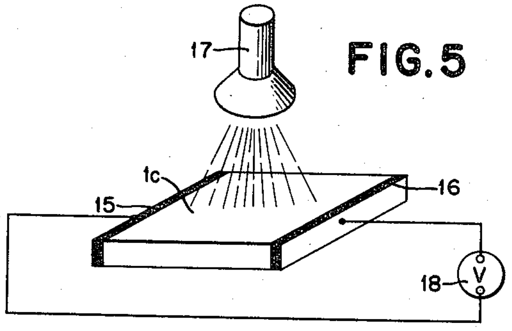
Figure 5 is an infrared filter having a body of semiconductor zinc arsenide.
Figure 6:
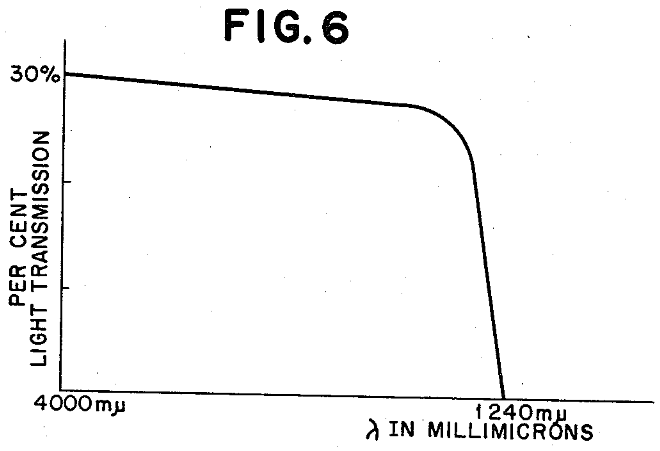
Figure 6 is a graph showing the light transmission of the zinc arsenide material.

Semiconductor zinc arsenide has also been found to act as a filter for infrared energy. Referring now to Figure 5 an illustration of an infrared energy filter is shown wherein a body of zinc arsenide 1*c* is provided with spaced ohmic contacts 15 and 16. Light as from source 17 impinging on the semiconductor device body 1*c* is transmitted up to the infrared region. In the infrared region all light is absorbed and indicating means shown as a meter 18 connected between terminals 15 and 16 would indicate an abrupt change in the amount of energy absorbed by the body 1*c* when energy having a wavelength in this range is applied. This is further illustrated in Figure 6 which illustrates the variation of the percentage of light transmitted by the body 1*c* of Figure 5 with wavelength of the light. It should be noted that the curve is fairly flat in the long wavelength region with a sharp variation being observed at a wavelength corresponding to the longest wavelength of the infrared region and that no transmission takes place at shorter wavelengths. Hence, an effective infrared filter may be made using semiconductor zinc arsenide by providing a sheet of this material having the desired area dimensions to cover the light source and having a thickness dimension such that the desired quantity of long wavelength light is transmitted. In a particular example a sheet of semiconductor zinc arsenide approximately .005 inch thick was found to transmit approximately 30% of the impinging light up to the infrared region.

While there have been shown and described and pointed out the fundamental novel features of the invention as applied to a preferred embodiment, it will be understood that various omissions and substitutions and changes in the form and details of the device illustrated and in its operation may be made by those skilled in the art without departing from the spirit of the invention. It is the intention therefore, to be limited only as indicated by the following claims.

What is claimed is:

1. A semiconductor device comprising a body and a plurality of contacts to said body, wherein said body comprises zinc arsenide ($Zn_3As_2$) as a major constituent in a concentration of greater than 99 percent, said body having a minor constituent of at least one conductivity directing impurity in a concentration less than one percent.

2. A semiconductor rectifier comprising a body of zinc arsenide ($Zn_3As_2$) containing a predominance of one conductivity type directing impurity, an ohmic contact made to one portion of said body, and a rectifying contact made to another portion of said body.

3. A semiconductor rectifier comprising a body of semiconductor zinc arsenide ($Zn_3As_2$) having at least two contiguous zones of opposite type conductivity separated by a junction barrier, a first ohmic connection to one of said zones, and a second ohmic connection to the remaining zone.

4. A transistor comprising a body of semiconductor zinc arsenide ($Zn_3As_2$), an ohmic base connection to one region of said body, a collector connection to said body appropriately spaced from said base connection, and an emitter connection to said body appropriately spaced from said collector connection and from said base connection.

5. The transistor of claim 4 wherein said emitter and said collector connections are rectifying point contacts.

6. The transistor of claim 4 wherein said emitter is a region of opposite type conductivity from said body and forming a junction barrier therewith and said collector is a point contact.

7. The transistor of claim 4 wherein said collector is a region of opposite type conductivity from said body and forming a junction barrier therewith and said emitter is a point contact.

8. A transistor comprising a body of semiconductor zinc arsenide ($Zn_3As_2$) including three contiguous zones of alternately opposite conductivity type and ohmic connections to each of said three zones.

9. A photosensitive semiconductor device comprising in combination a body of semiconductor zinc arsenide ($Zn_3As_2$) and a plurality of contacts to said body.

10. A photosensitive semiconductor device comprising a body of semiconductor zinc arsenide ($Zn_3As_2$), a first ohmic contact to said body and a second ohmic contact to said body separated from said first contact.

References Cited in the file of this patent

UNITED STATES PATENTS

| | | |
|---|---|---|
| 1,751,361 | Ruben | Mar. 18, 1930 |
| 2,706,791 | Jacobs et al. | Apr. 19, 1955 |
| 2,754,456 | Madelung | July 10, 1956 |

FOREIGN PATENTS

| | | |
|---|---|---|
| 719,873 | Great Britain | Dec. 8, 1954 |